United States Patent
Lund-Hansen

(10) Patent No.: US 6,384,314 B1
(45) Date of Patent: May 7, 2002

(54) SOLAR CELL SYSTEM AND METHOD OF ESTABLISHING THE SYSTEM

(75) Inventor: Kjeld Balslev Lund-Hansen, Skødstrup (DK)

(73) Assignee: Alu-PV A/S, Lystrup (DK)

( * ) Notice: Subject to any disclaimer, the term of this patent is extended or adjusted under 35 U.S.C. 154(b) by 0 days.

(21) Appl. No.: 09/422,091

(22) Filed: Oct. 21, 1999

Related U.S. Application Data

(63) Continuation of application No. 08/930,062, filed as application No. PCT/DK96/00228 on May 30, 1996, now abandoned.

(30) Foreign Application Priority Data

May 30, 1995 (DK) .............................................. 0610/95

(51) Int. Cl.[7] .......................... H01L 25/00; E04D 13/18; F24J 2/46
(52) U.S. Cl. ...................... 136/246; 136/244; 136/251; 136/291; 126/621; 126/623; 52/173.3
(58) Field of Search ................................ 136/244, 251, 136/291, 246; 126/621, 623; 52/173.3

(56) References Cited

U.S. PATENT DOCUMENTS

| | | | |
|---|---|---|---|
| 4,126,150 A | | 11/1978 | Bell et al. |
| 4,915,743 A | * | 4/1990 | Schilling .................... 136/256 |
| 5,021,099 A | * | 6/1991 | Kim et al. ................... 136/249 |
| 5,228,924 A | * | 7/1993 | Barkes et al. ............... 136/246 |
| 5,232,518 A | * | 8/1993 | Nath et al. .................. 136/251 |
| 5,409,549 A | * | 4/1995 | Mori ........................... 136/244 |

FOREIGN PATENT DOCUMENTS

| | | | |
|---|---|---|---|
| DE | 23 35 916 | * | 2/1974 |
| DE | 25 32 153 | * | 2/1976 |
| DE | 2 532 153 | | 2/1976 |
| EP | 0 625 802 | | 11/1994 |
| GB | 2 182 135 | * | 2/1985 |
| JP | 60-34078 | * | 2/1985 |

OTHER PUBLICATIONS

Brochure 331/T.D. 46, COLT International, Technisches Datenblatt Sonnenschutz–System, Typ UNISUN.

* cited by examiner

*Primary Examiner*—Rena L. Dye
*Assistant Examiner*—Michael C. Miggins
(74) *Attorney, Agent, or Firm*—Nixon Peabody LLP; David S. Safran

(57) ABSTRACT

Solar cell systems are normally made as a number of panel plates sized typically 0.5–1×1 m, with associated mounting means for holding the plates in suitably inclined positions relative to a horizontal or vertical mounting base. According to the invention, these panel plates may advantageously be changed into a lamella-shaped structure, e.g. with a width of only 10–20 cm and, in return, with a much larger length dimension, whereby strips of a solar cell sheet material can be supported by already highly developed and inexpensive carrier systems, whether or not these also serve another purpose with respect to sun shading. A number of relevant advantages is obtained in using carrier laminae made of aluminium.

12 Claims, 2 Drawing Sheets

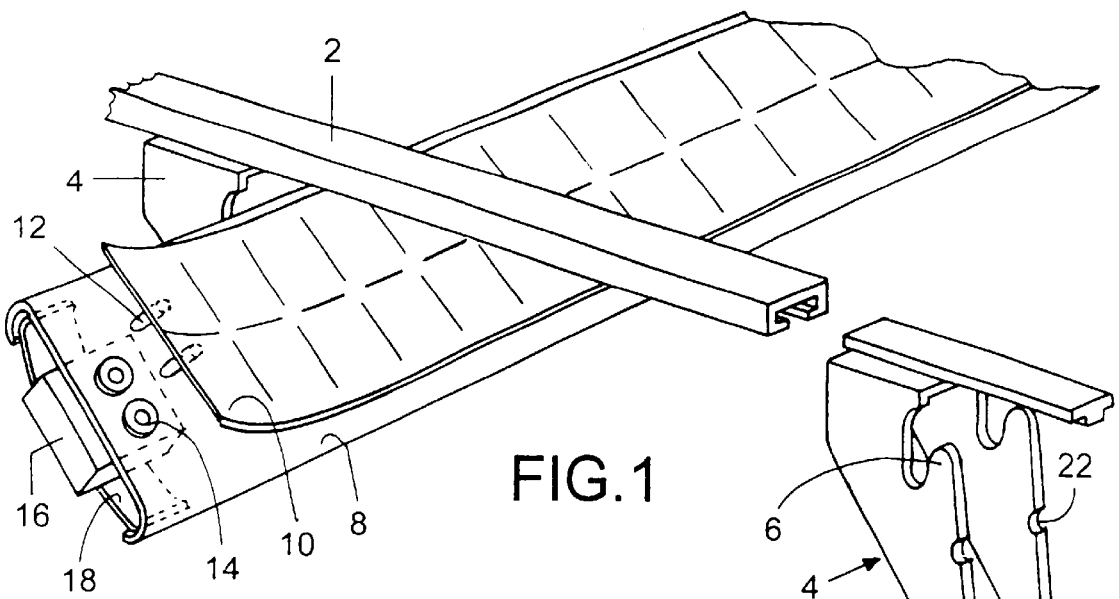
FIG.1
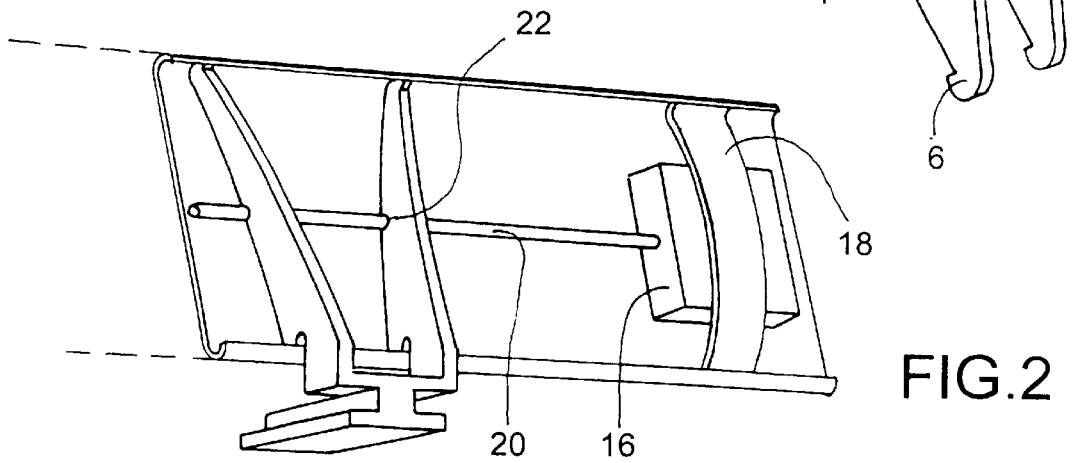
FIG.2
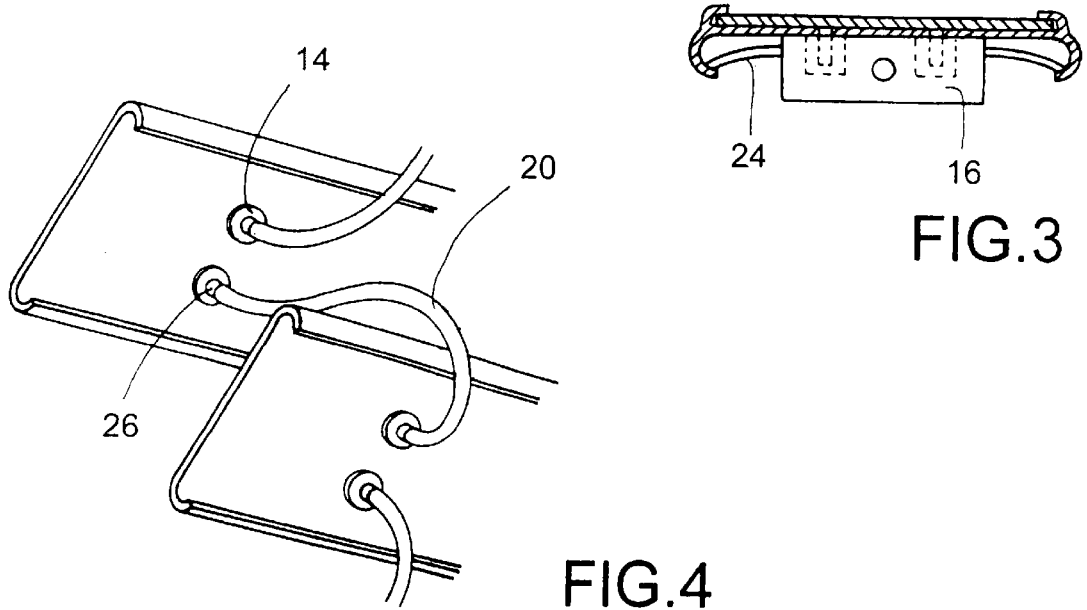
FIG.3
FIG.4

SOLAR CELL SYSTEM AND METHOD OF ESTABLISHING THE SYSTEM

This application is a continuation of U.S. application Ser. No. 08/930,062, filed Nov. 29,1997, now abandoned, which is a 871 09 PCT/DK96/00228 filed May 30, 1996.

The present invention relates to a solar cell system for direct conversion of solar energy to electricity. During the recent years this technique has been widely developed, the cell structures being both cheaper and more effective, and besides, they have become more easily applicable, e.g. in being delivered as a reeled web for mounting in desired sizes on suitable supports. Thereby, real solar cell panels may be built up by local manufacturers or contractors for mounting of the panels on power station areas or on roof or wall areas of buildings, where the panels can be joined so as to cover large areas.

A typical panel size is some ½–1 square meter, e.g. with dimensions 0.5×1 m. Such panels may hold 30–40 solar cells which, when connected in series, may provide a working voltage of 14–18 Volts by direct incidence of the sunlight, this being suitable for the charging of 12 V battery systems. For this purpose the panels may be connected in parallel, but of course they can also be connected in series for generation of a higher voltage. This can be determined in detail for each individual system, all according to the available number of panels.

The panels are mounted most efficiently with equatorially directed angle of incident, i.e. facing south on the northern hemisphere, and with an inclination adjusted according to the relevant latitude such that the average sun in fall can be maximum. In power parks and on flat building roofs this can be achieved by means of suitable carrier structures. In connection with buildings there may sometimes be ideal conditions on inclined roofs facing south, but otherwise it may be fully acceptable to use a less optimal mounting base, e.g. a less optimally inclined roof or even a vertical building wall, inasfar as from a constructional point of view it will be cost saving if the relevant surface can be used for supporting the panels in a direct manner, without the use of carrier structures. It is then possible and also practised to arrange solar cell panels in an architectonically acceptable manner as facade covering units or e.g. as vertical balcony walls.

The invention is based on the consideration that there are certain building parts which, with full architectonical accept, may appear with pronounced slanting orientation, viz. sun shading lamellae mounted outside windows with strong sun infall. These lamellae do not constitute real building faces, but it will be appreciated that they are very well suitable as supports for a solar cell system. Hereby, the traditional conception of solar cell panels as independent, concentrated plate elements should be left behind, as instead elongate and relatively narrow carriers are used for the purpose, e.g. with a width of only 10–20 cm and moreover of such a type which, at the outset, also serves a different purpose, viz. sun shading. These relatively narrow lamellae are well suited as carriers for strips of the said solar cell web material on their outside, as the cells of the material are easily arranged in such a manner that they can be commutated from widely spaced areas and thus generate a desired voltage anyhow. Alternatively, parallel rows of solar cells may be mutually connected at one end, whereby they can be commutated in closely juxtaposed points at the other end.

Apart from any required adaptation of the width of the solar cell web, should it not simply be cuttable into a required smaller width, the invention involves some special circumstances of electrical, mechanical and thermal nature, respectively:

1: COMMUTATION:

In conventional panel systems it is possible to use internal, hidden and factory or workshop mounted series and parallel connections, such that the entire system may appear with a single connector terminal. With the invention it is to be envisaged that it may be required to make extensive use of external wirings and terminations made in situ in conjunction with the mounting work. The lamella technique itself, with lamellae and associated carrier systems, is independently highly developed, and with the invention it is highly undesired to introduce principal modifications in these mechanical systems. As the lamellae extend in parallel and with mutual spacing it will, in practice, be indispensable that wires should be mounted across and, optionally, along these gaps, and special commutation devices should be provided, preferably to be held by the lamellae themselves.

The proper solar cell material will typically be electrically terminated by one or two projecting wires at opposite ends or at one same end of the solar cell strip, respectively, these wires just as typically consisting of flat conductors enclosed between cover sheets endwise projecting from the cell strip. For commutating these conductors, according to the invention, the outer sheet layer can be cut away in local areas above the conductors, while in a nearby area a hole is punched through both the sheet strip and the lamella itself for forming a socket hole, in which there is mounted a wired commutation block provided with one or two contact portions to abut the respective, exposed conductor area or areas a safe abutment being ensured by mechanically clamping together the commutation block and a holding part on the other side of the lamella. Such a mounting can be made in situ, and for the connection of the solar cell strips in series or in parallel across a common end area of the lamellae it is possible to use pre-prepared wire connected commutation blocks with a wire length adapted to the distance between the lamellae, such that the electrical connection work can be reduced to a minimum.

Also, it is thus achievable in a simple manner that the fitters should not be particularly careful for observing a natural requirement of the lamina construction as a whole be kept electrically insulated from the solar cell system. Moreover, the commutation blocks may be designed such that in addition to being insulating they can also be effectively covering the commutation areas, whereby these remain fully protected against corrosion.

2: APPLICATION OF CARRIER STRUCTURE:

The said already highly developed carrier structures for the lamellae will be applicable not only in connection with sun shading systems, but also in general on building surfaces, e.g. building walls and flat roofs or for that sake on pitched roofs, the inclination of which only is not optimum for solar cell panels at the particular place. The carrier structures, including the lamellae themselves, are developed to a high degree of standardization at low costs, and since the lamellae will be perfect carriers for the thin and light cell web material, they are advantageously usable as solar cell panels practically anywhere.

This will or may result in a noticeable change in the technical/architectonical look of the relevant mounting surfaces. Traditionally, the said relatively large, inclined solar cell panels have been mounted in rows with correspondingly large spacings on horizontal surfaces, whereby the surface will visually appear with a pronounced 'oblique panel' structure. With the invention the corresponding oblique panels will be noticeably less projecting, without having reduced capacity because of their higher number. The relevant surface, which may also be a vertical building surface, may then be laid out with a smoothened appearance. It will still be 'toothed', but not more than might well be aimed at by an architectonical decoration of a non-technical character. The look, therefore, will be much more acceptable than in case of conventional solar panels, and with the use of the said specialized carrier structures the installation will even be advantageous with respect to costs. Additionally, due to its smaller modular size in one main direction, viz. across the lamellae, and a less critical modular size in the other main direction, viz. along the lamellae, the installation can more easily be brought to cover areas with irregular boundaries, e.g. in connection with windows in a building wall. It will be another concept that according to the starting point of the invention there may also be mounted solar cell strips on sun shading lamellae provided on a carrier structure mounted above the windows, projecting more or less perpendicularly from the vertical building wall.

Usually, the carrier structures are made up as a series of parallel, light profiles of aluminium which, with the use of suitable mounting fittings, are fastened to the underlying building surface, normally outwardly projecting therefrom; the profiles have profiled grooves in which they receive foot portions of respective rows of lamella holders of plastics, these carrying the lamellae, which extend across the said profiles, solely by a resilient clamping action. The entire system is light and simple due to the relative littleness of the individual lamellae, so the construction will be ideal also in the present connection, no matter whether a given system should additionally serve a sun shading purpose.

In the relevant connection, the use of plastic holders is ideal in that these holders will automatically form an electrical insulation between the single lamellae and the carrier construction, whereby an unintentional electrical leakage between a solar cell strip and a lamella will be kept isolated to the particular lamella.

3: THERMAL CONDITIONS:

The said known lamella systems are, as mentioned, made with lamellae of aluminium, which in the present connection is of particular relevance, such that according to the invention it is highly advantageous to use that kind of lamellae and therewith also the related carrier structures. In this respect the invention builds on the insight that the normally darkcoloured solar cell elements are naturally liable to be heated strongly by the sun rays and that the efficiency of the solar cells decreases by increasing temperature. For the invention, therefore, it is important to consider a cooling of the cell elements, which may well, in sunshine, adopt a temperature of 60–80° C., with an associated efficiency decrease of near 10% relative to normal ambient temperatures. In this connection it is of noticeable effect that the element supporting structure is of the well heat conducting aluminium and that the same structure appears in open air surroundings in connection with the relevant carrier structure, as the air may then act cooling on the solar cell elements not only at the outside thereof, but also via the free underside of the associated carrier plate of relatively thin aluminium.

As far as this aspect is concerned it will be advantageous to make use of lamellae having their rear sides profiled with projecting cooling ribs or, themselves, being profiled with interior channels for cooling water. In the latter case the cooling water will be heated by the sun, such that it will additionally applicable in an associated heat pump system for further increase of the efficiency of the system as a whole. The water should not be heated to such a degree that it loses a reasonable cooling effect, but optionally a further heating may be arranged in aftercoupled solar heat collectors for that purpose. Even for that purpose it could be possible to use the said lamellae, which should then only be heat insulated at the cold side.

4: REFLECTION:

Usually, the standard lamellae are mounted rowwise, in suitably inclined positions and with a relatively small mutual distance. This pattern will also be particularly relevant for the invention, when the lamellae are made of aluminium, because the light and smooth rear lamella surfaces will reflect diffuse light against the solar cells on the respective neighbour lamellae, this contributing measurably to the efficiency of the cells.

5: FIXATION:

With the invention it is found desirable to make use of a solar cell material of the thin film type, already for ensuring that the added material shall not influence the calculation basis for the entire lamella screen construction. The thin film should be effectively weather protected, and this can be achieved by enclosing the film between cover sheets of a suitable plastics material, joined face to face outside the edges of the thin film. The front side sheet may advantageously consist of Teflon, which—unlike glass—has no tendency to collect dust on its surface, while the rear sheet may be of the same or another, optionally non-transparent material, which should preferably be fixable directly to the lamella front sides.

When the lamellae consist of extruded aluminium it will be relatively simple to provide the modification of the lamellae being profiled with flange portions for receiving the opposite edges of the pliable and strip shaped solar cell film laminate, whereby already this may condition a fully sufficient fixation of the sheet strip.

A preferred solution, however, is to avoid such a modification and to secure the sheet strip directly to the front side of the lamella. This is easily achievable with the use of a suitable glue, e.g. of the EVA type with thermal actuation or so-called contact glue. It is a further possibility that the edge areas of the cover sheet strips as projecting beyond the edges of the solar cell strip can be secured to the lamella surfaces by a milling operation, again in particular when the lamellae consist of aluminium. Both hereby and with the use of gluing it may be possible to avoid the rear cover sheet strip, if or when it is possible to ensure a tight enclosure of the solar cell strip solely by the use of the outer cover strip. This will further have the advantageous effect that the rear cover sheet disappears as a heat insulating layer between the solar cell strip and the front side of the aluminium lamellae, whereby the desired cooling is promoted.

BRIEF DESCRIPTION OF THE DRAWINGS

In the following the invention is described in more detail with reference to the drawing, in which:

FIG. 1 is a perspective view of a section of a lamella system according to the invention, seen against the outside of a lamella;

FIG. 2 the same seen against the rear side of the lamella;

FIG. 3 is a sectional view of a lamella with electrical coupling means;

FIG. 4 is a perspective view of a pair of lamellae with electrical connections.

FIG. 1 shows a carrier structure principally of the type disclosed in DE-C-2335916, i.e. with parallel carrier beams 2 fixed in any suitable manner to a building and provided with a profilation suited for reception of plastic holders 4 with wing portions 6 for holding a C-profiled lamella 8, preferably of aluminium, such that a row of parallel lamellae can be mounted across the beams, In the said DE-C-2335916 this system is specifically indicated to be a sun shading system, but according to the present invention the system may be mounted wherever possible, without fulfilling any shading need, while there will also be wide limits for the constructive design of the beams, the holders and the laminae.

Figure 5:
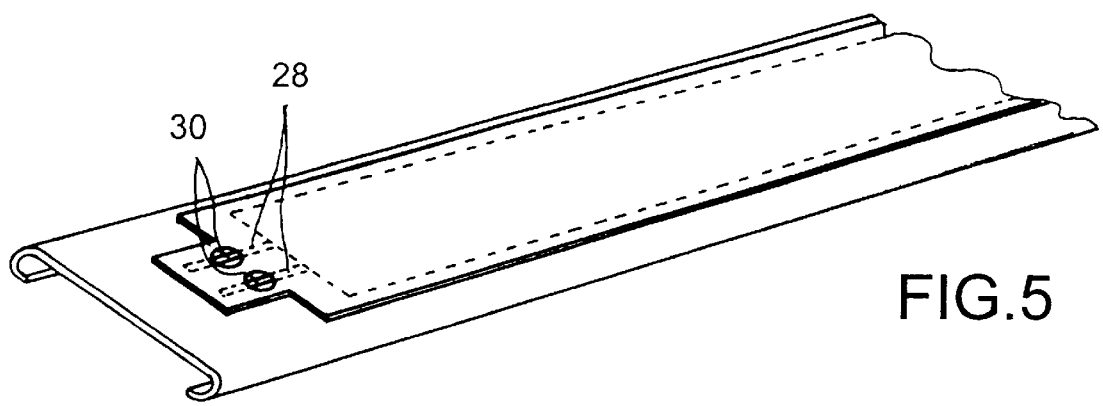
FIGS. 5–8 are different views illustrating preferred commutation system.

According to the invention the outer sides of the lamellae—that is the sun facing side, irrespectively of what could be called the front or rear side from a constructional point of view—are covered by a web strip 10 of a solar cell material. Electrically, these strips may be terminated by contact pins 12 which, through holes 14 in the lamellae, may be inserted in sockets 16 secured to the inner lamella side by suitable fixation means such as glue or a holding bridge 18 mounted between the free outer edges of the C-profile of the lamella, see also FIG. 2.

From the said sockets 16 it is required to arrange connection cables along or across the lamellae, and in FIG. 2 it is shown that a longitudinal wiring can be arranged in a held manner by passing the cable 20 through notches 22 in the holding wings of the lamella holders 4.

In FIG. 3 it is shown that the loose holding bridges 18 can be replaced by projecting wing parts 24 on the socket blocks 16, and that the lamellae 8 may be profiled especially for edge holding reception of the solar cell strips 10.

In FIG. 4 it is indicated that the solar cell strips may be electrically terminated by electrode parts 26 which, through the holes 14 in the lamellae, can be brought into clamp or soldering connection with cable pieces 20, which are here shown to extend crosswise between the lamellae. It is a possibility, however, that the commutation can be established just outside of the lamella end, thus not necessarily through holes 14 in the lamellae. A further possibility is that the cell strip is contacted at its own exterior side.

In a given system, of course, it should be planned carefully where the relevant electrical commutation places will be located, but this is facilitated by a superior planning with its associated comprehensive view of the total length/width extent of the lamella system. In return, any system made in accordance with the invention may be given an almost arbitrary extent in length and width of different partial areas thereof. Also, the solar cell material can be used very economically, since with the use of narrow strips with a width of only some 10–20 cm it can be adapted to individual lengths for achieving the highest possible effect from a total system.

FIGS. 5–8 illustrate a preferred type of commutation. As indicated in FIG. 5, the solar cell strip 10 is made with an active thin film layer laminated between plastic sheet strips, which are welded together outside the edges of the thin film; the latter has two projecting, flat conductor strips 28. One of these is connected, e.g. by soldering, to the cell film or rather to a cell electrode immediately at the particular end of the panel strip 10, while the other extends to the opposite end thereof.

Figure 6:
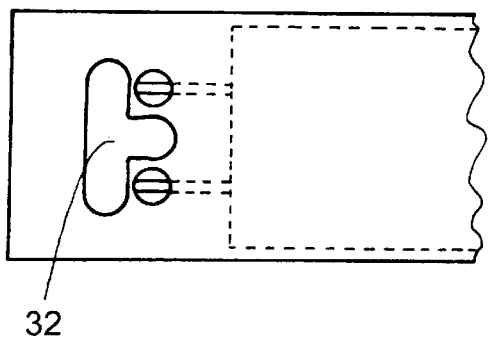
Figure 7:
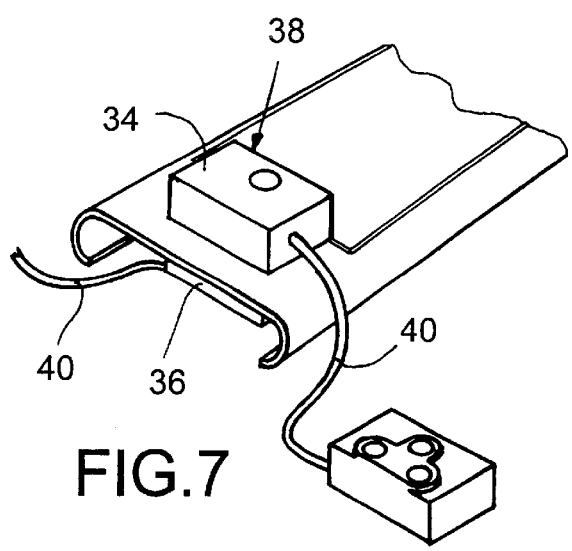
Figure 8:
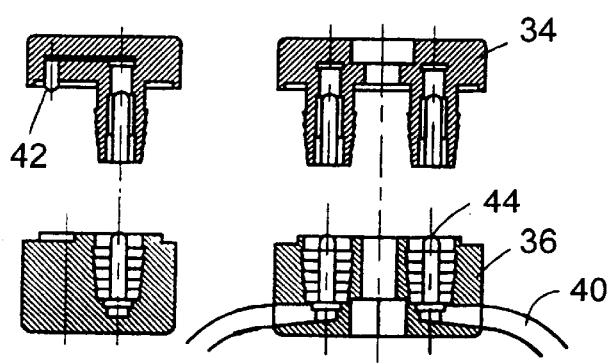

The exterior cover sheet is cut away in areas 30 for exposing the conductors 28, and as shown in FIG. 6 a T-shaped hole 32 is punched out in the sheet and the lamella 8 at these areas. In connection with this hole there is mounted the overpart 34 and the underpart 36 of a termination block 38, FIG. 7, which, in factory or workshop, is prepared with the required wire or wires 40. As shown in FIG. 8, the overpart 36 has a contact pin 42 which, when the two parts are drawn together, is brought to clamp against a respective, exposed conductor 28. In the embodiment shown, these pins 42 are connected to receiver sockets which by the mounting are joined with contact legs 44 in the underpart 36, these legs being connected with the cast in wires 40. Optionally, special sealing rings or packings may be used for increased safety of sealing about the terminal areas 30.

Such termination blocks may be produced with all relevant designs for co-operation with one or two termination areas and with cables connected in desired combinations to the respective over- and underparts. As indicated in FIG. 7, the blocks may be prepared with integrated cable pieces 40.

What is claimed is:

1. A solar cell system for direct conversion of solar energy to electricity comprising separate, elongated narrow strip-shaped sheets of active solar cells and a carrier structure formed of:

separate, elongated narrow strip-shaped carder plates formed of a thin thermally conductive sheet material, supports for supporting the narrow strip-shaped carrier plates in spaced relationship to each other and to a building exterior, and holding elements connecting the strip-shaped carrier plates to the supports with the strip-shaped carrier plates facing upwardly at a predetermined oblique angle, said holding elements being in resilient clamping engagement with the strip-shaped carrier plates and extending crosswise thereof at spaced locations along the length of the strip-shaped carrier plates;

wherein a respective one of the elongated narrow strip-shaped sheets of active solar cells is mounted on an upper surface of each of the strip-shaped carrier plates; and wherein the separate, elongated narrow strip-shaped sheets of active solar cells on the separate, strip-shaped carrier plates are electrically connected to each other to form a solar cell unit.

2. The solar cell system according to claim 1, wherein said supports are beams on which the holding elements are fixed.

3. The solar cell system according to claim 2, wherein the strip-shaped carrier plates are mounted in spaced parallel relationship to each other.

4. The solar cell system according to claim 1, wherein the strip-shaped carrier plates are mounted in spaced parallel relationship to each other.

5. The solar cell system according to claim 1, wherein commutations are provided on an underside of the strip-shaped carrier plates at selected locations with connecting holes being provided in the strip-shaped caner plates at said locations, electrode parts of the sheets of active solar cells being connected to the commutations through said holes.

6. The solar cell system according to claim 5, wherein connection cables are arranged extending longitudinally along the underside of the strip-shaped carrier plates and being held thereagainst in notches formed in the holding elements.

7. The solar cell system according to claim 5, wherein the commutations comprise termination blocks secured to the strip-shaped carrier plates by holding clamps.

8. The solar cell system according to claim 1, wherein the sheets of active solar cells are mounted between wider cover sheets, the cover sheets being welded together at opposite edges thereof and secured to the strip-shaped carrier plates by one of gluing and welding.

9. The solar cell system according to claim 1, wherein the strip-shaped carrier plates have a width of about 10–20 cm.

10. Method of installing a solar cell system comprising the steps of:

mounting carrier supports extending on a building exterior at a plurality of spaced locations;

connecting each of a plurality of separate, elongated narrow strip-shaped carrier plates formed of a thin thermally conductive sheet material to the carrier supports in spaced relationship to each other and the building exterior, facing upwardly at a predetermined oblique angle; and mounting each of a plurality of separate, elongated narrow strip-shaped sheets of active solar cells on an upper surface of a respective one of the strip-shaped carrier plates;

where in a solar cell area and a position arrangement for producing an optimized electric production effect is determined and the strip-shaped sheets of active solar cells are mounted and provided with electrical terminations at locations connecting the separate strip-shaped sheets of active solar cells in to a unit adapted to create the arrangement determined.

11. A solar cell system for direct conversion of solar energy to electricity comprising separate, elongated narrow strip-shaped sheets of active solar cells and a carrier structure formed of:

separate, elongated narrow strip-shaped carrier plates formed of a thin thermally conductive sheet material, supports for supporting the narrow strip-shaped carrier plates in spaced relationship to each other and to a building exterior, and holding elements connecting the strip-shaped carrier plates to the supports with the strip-shaped carrier plates facing upwardly at a predetermined oblique angle, said holding elements being in resilient clamping engagement with the strip-shaped carrier plates and extending crosswise thereof at spaced locations along the length of the strip-shaped carrier plates;

wherein the strip-shaped carrier plates have flange portions for receiving opposite edges of the elongated narrow strip-shaped sheets of active solar cells for mounting ofthe strip-shaped sheets of active solar cells on an upper surface of the strip-shaped carrier plates.

12. The solar cell system according to claim 11, wherein said strip-shaped carrier plates are extruded profiles of which the flange portions are also formed.

* * * * *